(12) United States Patent
Takazane

(10) Patent No.: US 11,140,782 B2
(45) Date of Patent: Oct. 5, 2021

(54) DISPLAY DEVICE AND ELECTRONIC APPLIANCE

(71) Applicant: SHARP KABUSHIKI KAISHA, Sakai (JP)

(72) Inventor: Yohichi Takazane, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 7 days.

(21) Appl. No.: 16/718,851

(22) Filed: Dec. 18, 2019

(65) Prior Publication Data

US 2020/0205293 A1 Jun. 25, 2020

(30) Foreign Application Priority Data

Dec. 20, 2018 (JP) .............................. JP2018-238954

(51) Int. Cl.
*H05K 1/18* (2006.01)
*G09F 9/30* (2006.01)
*H05K 1/02* (2006.01)

(52) U.S. Cl.
CPC ............. *H05K 1/189* (2013.01); *G09F 9/301* (2013.01); *H05K 1/0277* (2013.01); *H05K 2201/10128* (2013.01)

(58) Field of Classification Search
CPC ................. H05K 1/189; H05K 1/0277; H05K 2201/10218; G09F 9/301
See application file for complete search history.

(56) References Cited

U.S. PATENT DOCUMENTS

| 2014/0045283 | A1* | 2/2014 | Hirakata | H01L 51/003 438/22 |
| 2014/0307396 | A1* | 10/2014 | Lee | H05K 1/028 361/749 |
| 2015/0092362 | A1* | 4/2015 | Ahn | G02F 1/133305 361/749 |
| 2016/0316577 | A1* | 10/2016 | Yamamoto | H05K 1/0296 |
| 2016/0352031 | A1* | 12/2016 | Ito | G06F 3/04164 |
| 2018/0196300 | A1* | 7/2018 | Jung | H05K 1/0277 |

FOREIGN PATENT DOCUMENTS

JP 2007-079133 A 3/2007

* cited by examiner

*Primary Examiner* — Hoa C Nguyen
(74) *Attorney, Agent, or Firm* — ScienBiziP, P.C.

(57) ABSTRACT

A display device includes a display panel having a curved shape that is curved such that a convex surface thereof faces the outside of a housing of the electronic appliance and also includes a circuit board that is connected to the display panel at a connection point and is curved so as to correspond to the curved shape of the display panel. In the display device, the circuit board extends outward from the display panel and is bent into a U shape in such a manner that an end of the circuit board faces toward a central portion of the display panel. In addition, the circuit board has an extension portion that is formed so as to extend from the connection point in the same direction as an extending direction of the display panel.

4 Claims, 2 Drawing Sheets

ABSTRACT

DISPLAY DEVICE AND ELECTRONIC APPLIANCE

BACKGROUND

1. Field

The present disclosure relates to a display device and an electronic appliance.

2. Description of the Related Art

Japanese Unexamined Patent Application Publication No. 2007-79133 discloses a display module of which the width of the frame can be reduced and the thickness can be also reduced. The display module includes a liquid crystal panel and a display-panel driving circuit. The display module also includes a flexible printed circuit board that is connected to an end of the liquid crystal panel and is bent toward the backside of the liquid crystal panel.

The display panel according to Japanese Unexamined Patent Application Publication No. 2007-79133 has a flat shape. Due to the flatness, a stress-concentrated region is not generated in the display panel when the end portion of the flexible printed circuit board is bent into a U shape at the end of the liquid crystal panel. However, in the case of the display panel being formed into a curved shape, stresses may be concentrated in the U-shaped portion of the flexible printed circuit board and in the vicinity of the bent portion. The stress concentration may pose a problem of wire breakage occurring at a location such as the bent portion.

SUMMARY

Accordingly, it is desirable to provide a display device that can suppress the occurrence of wire breakage at a location such as the U-shaped portion when the circuit board such as a flexible printed circuit board is bent into a U shape at the end of the display panel.

According to an aspect of the disclosure, a display device included in an electronic appliance includes a display panel having a curved shape that is curved such that a convex surface thereof faces outside of a housing of the electronic appliance and also includes a circuit board that is connected to the display panel at a connection point and is curved so as to correspond to the curved shape of the display panel. In the display device, the circuit board extends outward from the display panel and is bent into a U shape in such a manner that an end of the circuit board faces toward a central portion of the display panel. In addition, the circuit board has an extension portion that is formed so as to extend from the connection point in the same direction as an extending direction of the display panel.

According to another aspect of the disclosure, an electronic appliance includes at least one display device. In the electronic appliance, the display device includes a display panel having a curved shape that is curved such that a convex surface thereof faces outside of a housing of the electronic appliance and also includes a circuit board that is connected to the display panel at a connection point and is curved so as to correspond to the curved shape of the display panel. The circuit board extends outward from the display panel and is bent into a U shape in such a manner that an end of the circuit board faces toward a central portion of the display panel. In addition, the circuit board has an extension portion that is formed so as to extend from the connection point in the same direction as an extending direction of the display panel.

Advantageous Effects of Invention

An aspect of the disclosure advantageously can suppress the occurrence of wire breakage at a location such as a U-shaped portion when a circuit board such as a flexible printed circuit board is bent into a U shape at a end of the display panel.

DESCRIPTION OF THE EMBODIMENTS

First Embodiment

Figure 1:
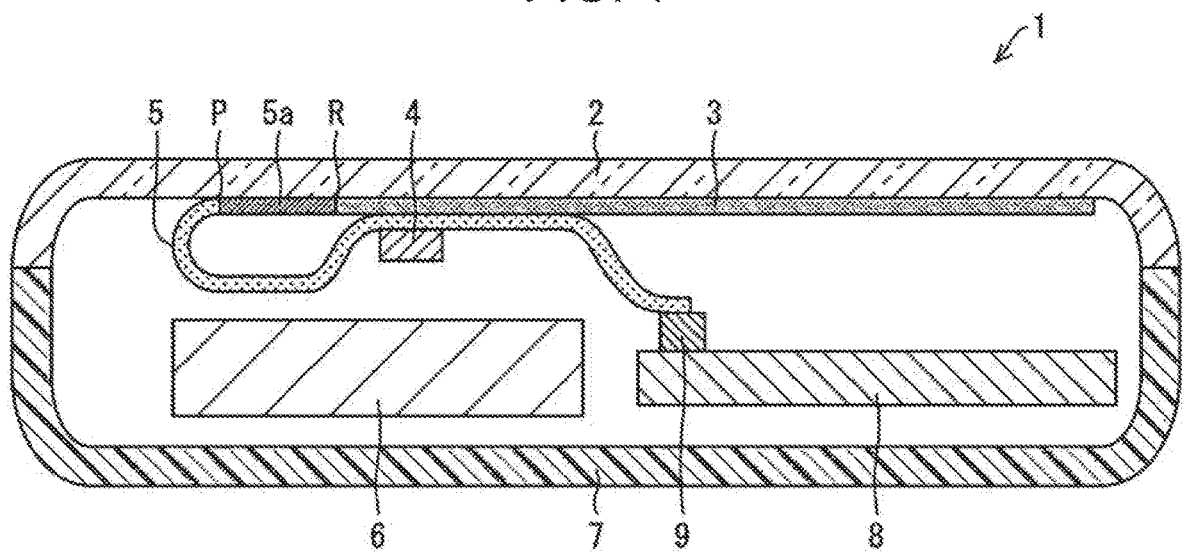
FIG. 1 is a schematic view illustrating a general configuration of an electronic appliance according to a first embodiment of the present disclosure.

An embodiment according to the present disclosure will be described with reference to FIGS. 1 and 2. Note that a display device according to the present embodiment is curved in such a manner that the convex surface of the display device faces the outside of a housing 7 of an electronic appliance 1. The display device is used, for example, in an electronic appliance, such as a smartphone.

The electronic appliance 1 according to the present embodiment includes a glass cover 2, a display panel 3 (a main portion of a circuit board 5), a driving circuit 4, a circuit board 5, a battery 6, a housing 7, a control board 8, and a circuit board connection portion 9.

The glass cover 2 has a curved shape such that the convex surface of the glass cover 2 faces the outside of housing 7 of the electronic appliance 1. The display panel 3, which is the main portion of the circuit board 5, is a device for displaying images.

The display panel 3 is adhered to the glass cover 2 up to a connection point R. Accordingly, the display panel 3 is also curved so as to follow the shape of the glass cover 2. The display panel 3 is disposed further inside the housing 7 than the glass cover 2. The circuit board 5 extends outward from the display panel 3 and is folded back into a U shape in such a manner that the end of the circuit board 5 faces toward the central portion of the glass cover 2. The circuit board 5 has an extension portion 5*a* that is formed so as to extend from the connection point R between the extension portion 5*a* and the display panel 3 in the same direction as the extending direction of the display panel 3. When a longitudinal section of the display panel 3 is viewed, the extension portion 5*a* extends in such a manner that a contact line of the extension portion 5*a* in contact with the glass cover 2 is substantially aligned with a contact line of the display panel 3 in contact with the glass cover 2 at the longitudinal end of the display panel 3.

According to this configuration, when the circuit board such as the flexible printed circuit board is bent into a U shape at the end thereof in the extending direction, the U-shaped portion is formed at a position away from the connection point R. This reduces the influence of curvature of the flexible printed circuit board and thereby suppresses the likelihood of wire breakage occurring at a location such as the U-shaped portion.

The driving circuit 4 is not specifically limited here but may be a driver IC for driving the display panel 3. The circuit board 5 may be formed of, for example, any one of the display panel, the flexible printed circuit board, and a film-like circuit board (COF, i.e., Chip on Film).

The control board 8 includes, for example, a central processing unit (CPU) that integrally controls the electronic appliance 1. The circuit board connection portion 9 couples the end portion of the circuit board 5 with the control board 8.

Figure 2:
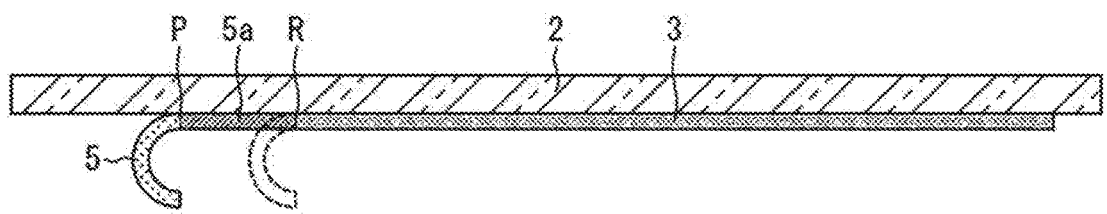
FIG. 2 is a schematic view illustrating a general configuration of a display device according to the first embodiment of the present disclosure.

If the circuit board 5 is bent into a U shape at a position immediately adjacent to the end of the display panel 3, as indicated by the broken line in FIG. 2, wire breakage may be caused at a location such as the U-shaped portion. Suppose, for example, a rectangular and flat sheet of paper is curled along a longitudinal center line of the sheet, and in this state, the sheet is further bent like a U shape along a line parallel to the lateral direction. In this case, angular portions will be generated here and there due to stresses being concentrated at the central portion of the curled sheet. For the reason similar to this, when the circuit board 5 is bent like a U shape, wire breakage may be caused at a location such as the U-shaped portion.

To avoid this, in the present embodiment, the extension portion 5a is provided so as to extend from the end of the display panel 3 in the extending direction of the glass cover 2, and a bending start point P at which the circuit board 5 starts to be bent into a U shape is positioned away from the end of the display panel 3, which thereby reduces the influence of curvature of the display panel 3.

Second Embodiment

Figure 3:
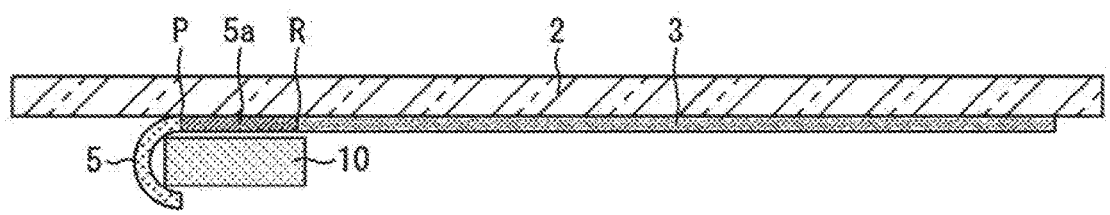
FIG. 3 is a schematic view illustrating a general configuration of a display device according to a second embodiment of the present disclosure.

Next, a second embodiment of the present disclosure will be described in detail with reference to FIG. 3. The second embodiment is different from the first embodiment in that the circuit board 5 and a driving circuit board (not illustrated) are adhered to each other using a spacer 10 in the second embodiment.

The driving circuit board that includes the driving circuit 4 for driving the display panel 3 is disposed further inside the housing 7 than the circuit board 5. The driving circuit board is adhered to the circuit board 5 using the spacer 10.

The length of the extension portion 5a in the extending direction may be defined by the relative position of the spacer 10 with respect to the circuit board 5. The bending start point of end portion of the circuit board 5 can be thereby adjusted.

The curvature of end portion of the circuit board 5 may be defined by the thickness of the spacer 10. This enables the curvature of end portion of the circuit board 5 to be adjusted. This can reduce the likelihood of the U-shaped portion being curved excessively and thereby reduce the likelihood of wire breakage occurring at a location such as the U-shaped portion.

Figure 4A:
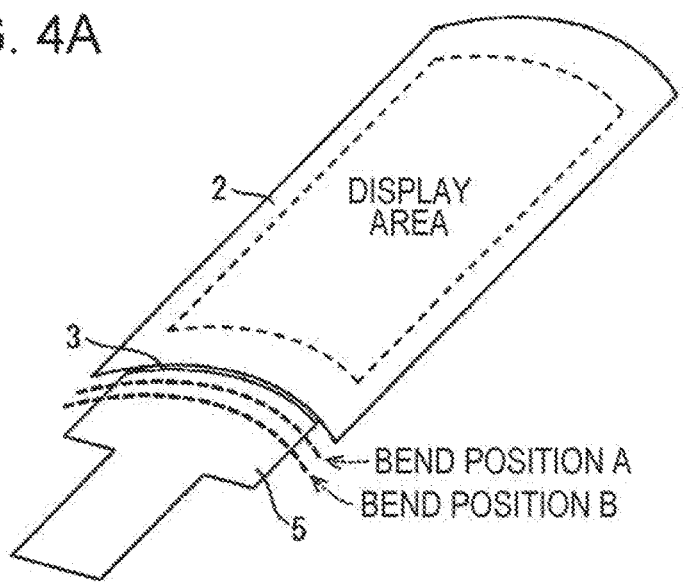
FIG. 4A is a perspective view illustrating a general configuration of the display device.

FIG. 4A illustrates a state of the display device of the present embodiment before the circuit board 5 is bent into a U shape. In the following description, a case in which the circuit board 5 is bent at a bend position A is compared with a case in which the circuit board 5 is bent at a bend position B.

Figure 4B:
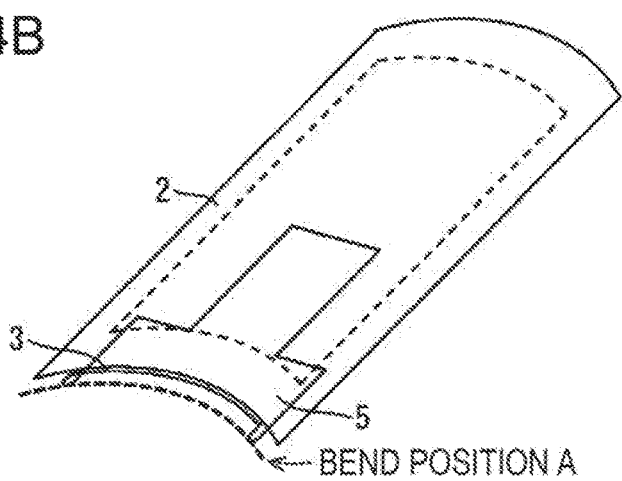
FIG. 4B is a perspective view illustrating a state in which a circuit board of FIG. 4A is bent at a bend position A.

FIG. 4B illustrates the case in which the circuit board 5 is bent at the bend position A. In the case of the circuit board 5 being bent into a U shape at a position immediately adjacent to the end of the display panel 3 (i.e., adjacent to the connection point R), as illustrated in FIG. 4B, the curvature of the display panel 3 largely affects the U-shaped bent portion, which may cause wire breakage.

Figure 4C:
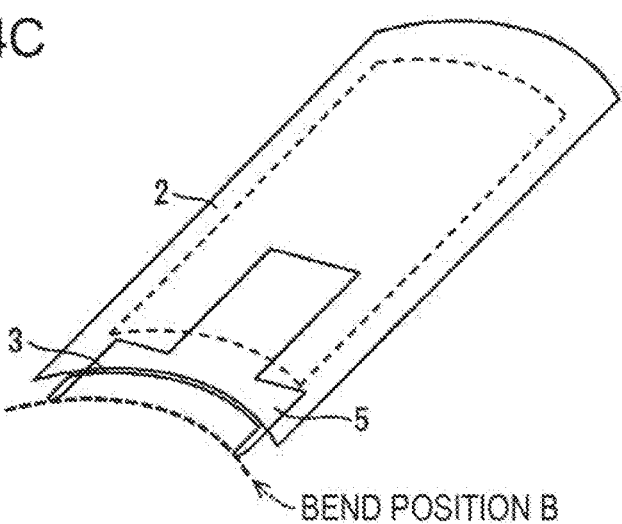
FIG. 4C is a perspective view illustrating a state in which the circuit board of FIG. 4A is bent at a bend position B.

In contrast, FIG. 4C illustrates the case in which the circuit board 5 is bent at the bend position B. In the case of the circuit board 5 being bent at the bend position B located away from the end of the display panel 3, as illustrated in FIG. 4C, the influence of curvature of the display panel 3 can be reduced compared with the bending at the bend position A. Note that the same effect can be obtained even if the circuit board 5 is covered by the glass cover 2 up to the bend position B at which the circuit board 5 starts to be bent.

In the above embodiments, it is described by way of example that the display panel continues to the circuit board. However, the present disclosure also covers a flexible printed circuit board, a film-like circuit board (COF), or the like, that is combined with the liquid crystal panel. The present disclosure also covers the case in which the flexible printed circuit board, the film-like circuit board (COF), or the like, is bent into a U shape. Configurations of the display device are summarized as follows.

A display device according to a first aspect of the present disclosure is included in an electronic appliance (e.g., the electronic appliance 1). The display device includes a display panel (e.g., the display panel 3) having a curved shape that is curved such that a convex surface thereof faces the outside of a housing (e.g., the housing 7) of the electronic appliance and also includes a circuit board (e.g., the circuit board 5) that is connected to the display panel at a connection point and is curved so as to correspond to the curved shape of the display panel. In the display device, the circuit board extends outward from the display panel and is bent into a U shape in such a manner that an end of the circuit board faces toward a central portion of the display panel. In addition, the circuit board has an extension portion (e.g., the extension portion 5a) that is formed so as to extend from the connection point in the same direction as an extending direction of the display panel. According to this configuration, even if the circuit board such as the flexible printed circuit board is bent into a U shape at the end of the display panel, the likelihood of wire breakage occurring at a location such as the U-shaped portion can be reduced.

In the display device, the length of the extension portion in the extending direction may be defined by a relative position of a spacer (e.g., the spacer 10) that is adhered to the extension portion. With this configuration, the curvature of the U-shaped portion can be adjusted, and the likelihood of wire breakage occurring at a location such as the U-shaped portion can be thereby reduced.

In the display device, the curvature of a U-shaped portion at which the circuit board is bent into the U shape is defined by a thickness of the spacer. With this configuration, the curvature of the U-shaped portion can be adjusted, and the likelihood of wire breakage occurring at a location such as the U-shaped portion can be thereby reduced.

An electronic appliance according to a second aspect of the present disclosure includes at least one display device described above. In the electronic appliance, the display device includes a display panel having a curved shape that is curved such that a convex surface thereof faces outside of a housing of the electronic appliance and also includes a circuit board that is connected to the display panel at a connection point and is curved so as to correspond to the curved shape of the display panel. The circuit board extends outward from the display panel and is bent into a U shape in such a manner that an end of the circuit board faces toward a central portion of the display panel. In addition, the circuit board has an extension portion that is formed so as to extend from the connection point in the same direction as an extending direction of the display panel. With this configuration, an advantageous effect described in relation to the first aspect of the present disclosure can be obtained.

The present disclosure is not limited to the embodiments described above, and various modifications can be made within the scope of invention set forth in the claims. Moreover, techniques disclosed in different embodiments may be appropriately combined to obtain new technical features and other embodiments. Thus, all such modifications and combinations are intended to be included within the scope of this invention.

The present disclosure contains subject matter related to that disclosed in Japanese Priority Patent Application JP 2018-238954 filed in the Japan Patent Office on Dec. 20, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device included in an electronic appliance, the display device comprising:
    a display panel having a curved shape that is curved such that a convex surface thereof faces outside of a housing of the electronic appliance; and
    a circuit board that is connected to the display panel at a connection point and is curved so as to correspond to the curved shape of the display panel, wherein
    the circuit board extends outward from the display panel and is bent into a U shape in such a manner that an end of the circuit board faces toward a central portion of the display panel,
    the circuit board has a first extension portion and a second extension portion both extending in a direction where the display panel extends,
    the first extension portion extends in the direction from the connection point,
    the circuit board is bent into the U shape between the first and second extension portions, and
    the first extension portion is curved so as to correspond to the curved shape of the display panel.

2. The display device according to claim 1, wherein a length of the first extension portion in an extending direction is defined by a relative position of an adhered spacer.

3. The display device according to claim 2, wherein a curvature of a U-shaped portion at which the circuit board is bent into the U shape is defined by a thickness of the spacer.

4. An electronic appliance comprising:
at least one display device, wherein
the display device includes
    a display panel having a curved shape that is curved such that a convex surface thereof faces outside of a housing of the electronic appliance, and
    a circuit board that is connected to the display panel at a connection point and is curved so as to correspond to the curved shape of the display panel,
    the circuit board extends outward from the display panel and is bent into a U shape in such a manner that an end of the circuit board faces toward a central portion of the display panel, and
    the circuit board has a first extension portion and a second extension portion both extending in a direction where the display panel extends,
    the first extension portion extends in the direction from the connection point,
    the circuit board is bent into the U shape between the first and second extension portions, and
    the first extension portion is curved so as to correspond to the curved shape of the display panel.

* * * * *